United States Patent
Chen et al.

(10) Patent No.: US 9,455,226 B2
(45) Date of Patent: Sep. 27, 2016

(54) SEMICONDUCTOR DEVICE ALLOWING METAL LAYER ROUTING FORMED DIRECTLY UNDER METAL PAD

(71) Applicant: MEDIATEK INC., Hsin-Chu (TW)

(72) Inventors: Chun-Liang Chen, Hsinchu County (TW); Tien-Chang Chang, Hsinchu (TW); Chien-Chih Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/165,594

(22) Filed: Jan. 28, 2014

(65) Prior Publication Data

US 2014/0217601 A1  Aug. 7, 2014

Related U.S. Application Data

(60) Provisional application No. 61/759,497, filed on Feb. 1, 2013.

(51) Int. Cl.
*H01L 23/48* (2006.01)
*H01L 23/528* (2006.01)
*H01L 23/00* (2006.01)

(52) U.S. Cl.
CPC ............ *H01L 23/5286* (2013.01); *H01L 24/05* (2013.01); *H01L 2224/05085* (2013.01); *H01L 2224/05624* (2013.01)

(58) Field of Classification Search
CPC ............................ H01L 23/522; H01L 23/528
See application file for complete search history.

(56) References Cited

U.S. PATENT DOCUMENTS

| | | | |
|---|---|---|---|
| 5,272,600 A * | 12/1993 | Carey | H01L 23/5384 174/255 |
| 5,629,838 A * | 5/1997 | Knight et al. | 361/782 |
| 6,191,023 B1 * | 2/2001 | Chen | H01L 24/03 257/E21.508 |
| 6,305,000 B1 * | 10/2001 | Phan et al. | 716/120 |
| 6,350,667 B1 * | 2/2002 | Chen | H01L 21/76843 257/E21.508 |
| 6,583,040 B1 * | 6/2003 | Lin | H01L 21/4853 438/107 |
| 6,614,091 B1 | 9/2003 | Downey | |
| 6,777,318 B2 * | 8/2004 | Jeng | H01L 21/76838 257/E21.582 |
| 7,094,676 B1 * | 8/2006 | Leu | H01L 23/3128 257/E23.178 |
| 7,791,210 B2 * | 9/2010 | Miller | H01L 23/49838 257/690 |
| 2003/0173668 A1 * | 9/2003 | Downey et al. | 257/750 |
| 2007/0063352 A1 * | 3/2007 | Archer et al. | 257/765 |
| 2007/0096320 A1 * | 5/2007 | Takemura | H01L 24/05 257/751 |
| 2010/0246152 A1 * | 9/2010 | Lin et al. | 361/783 |
| 2011/0049721 A1 * | 3/2011 | Koti et al. | 257/773 |
| 2014/0035095 A1 * | 2/2014 | Lin et al. | 257/528 |

FOREIGN PATENT DOCUMENTS

CN  1639865 A  7/2005

* cited by examiner

*Primary Examiner* — Nicholas Tobergte
(74) *Attorney, Agent, or Firm* — Winston Hsu; Scott Margo

(57) ABSTRACT

The present invention provides a semiconductor device. The semiconductor device comprises: a metal pad and a first specific metal layer routing. The metal pad is positioned on a first metal layer of the semiconductor device. The first specific metal layer routing is formed on a second metal layer of the semiconductor device, and directly under the metal pad.

20 Claims, 5 Drawing Sheets

SEMICONDUCTOR DEVICE ALLOWING METAL LAYER ROUTING FORMED DIRECTLY UNDER METAL PAD

CROSS REFERENCE TO RELATED APPLICATIONS

This application claims the benefit of U.S. Provisional Application No. 61/759,497, filed on Feb. 01, 2013 and included herein by reference.

BACKGROUND

The disclosed embodiments of the present invention relate to a semiconductor device, and more particularly, to a semiconductor device which can allow a metal layer routing formed directly under a metal pad.

Please refer to FIG. 1. FIG. 1 is a simplified top-view diagram of a conventional semiconductor device 100, wherein the semiconductor device 100 can be a chip. As shown in FIG. 1, the semiconductor device 100 comprises: a metal pad 102, a power line 104, and a ground line 106. However, the power line 104 and a ground line 106 can not be formed under the metal pad 102, and thus the semiconductor device 100 has a problem of requiring a large layout area for the power line 104 and a ground line 106.

SUMMARY

In accordance with exemplary embodiments of the present invention, a semiconductor device is proposed to solve the above-mentioned problem.

According to an aspect of the present invention, an exemplary semiconductor device is disclosed. The semiconductor device comprises: a metal pad and a first specific metal layer routing. The metal pad is positioned on a first metal layer of the semiconductor device. The first specific metal layer routing is formed on a second metal layer of the semiconductor device, and directly under the metal pad.

Briefly summarized, compared with prior art, since the semiconductor device disclosed by the present invention can allow a metal layer routing formed directly under a metal pad, the layout area size of the semiconductor device can be reduced effectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
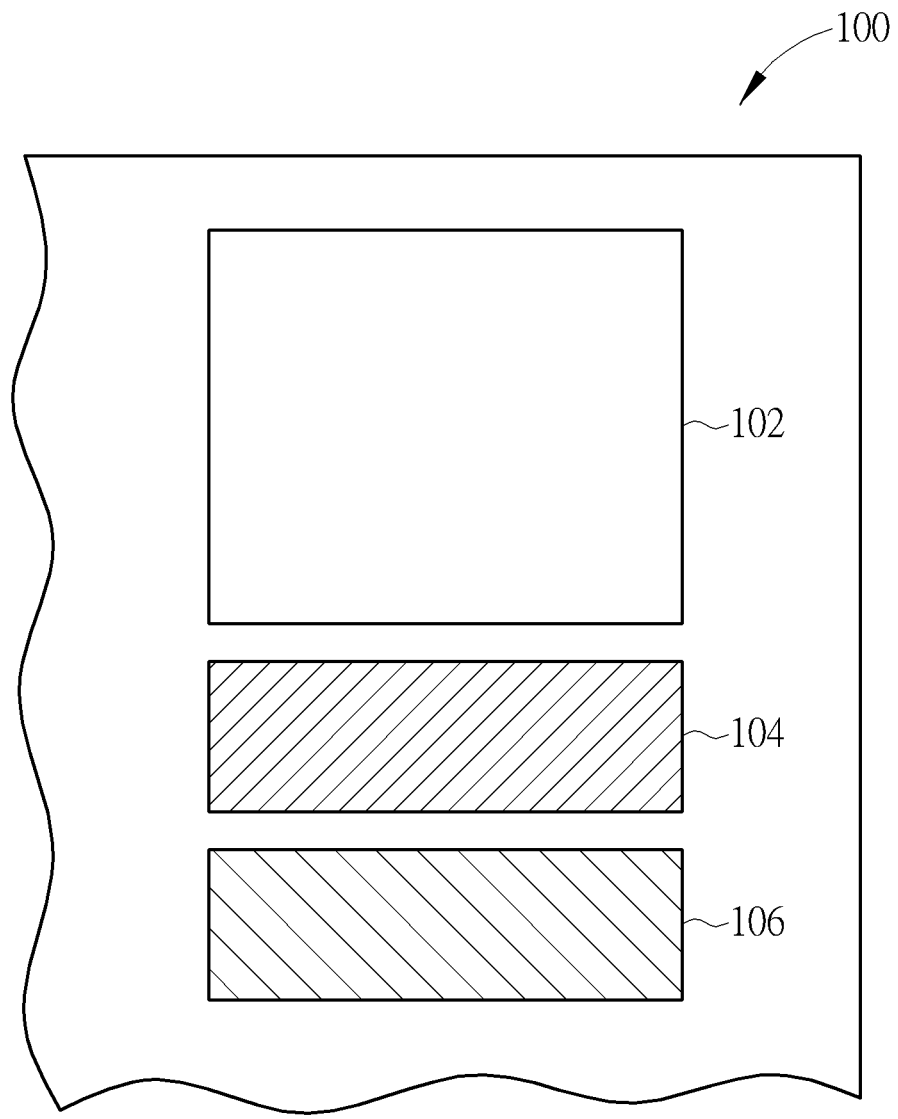
FIG. 1 is a simplified top-view diagram of a conventional semiconductor device.
Figure 2:
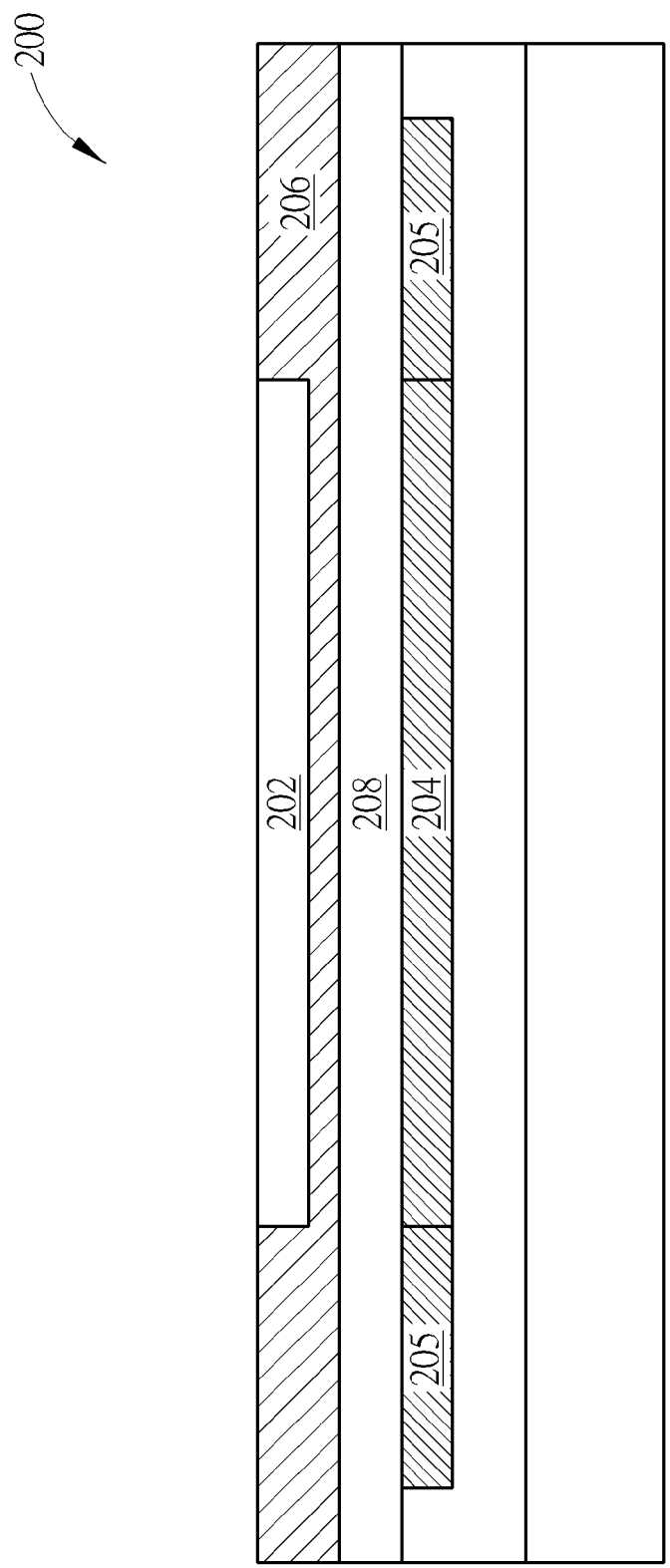
FIG. 2 is a simplified cross-sectional diagram of a semiconductor device according to a first exemplary embodiment of the present invention.
Figure 3:
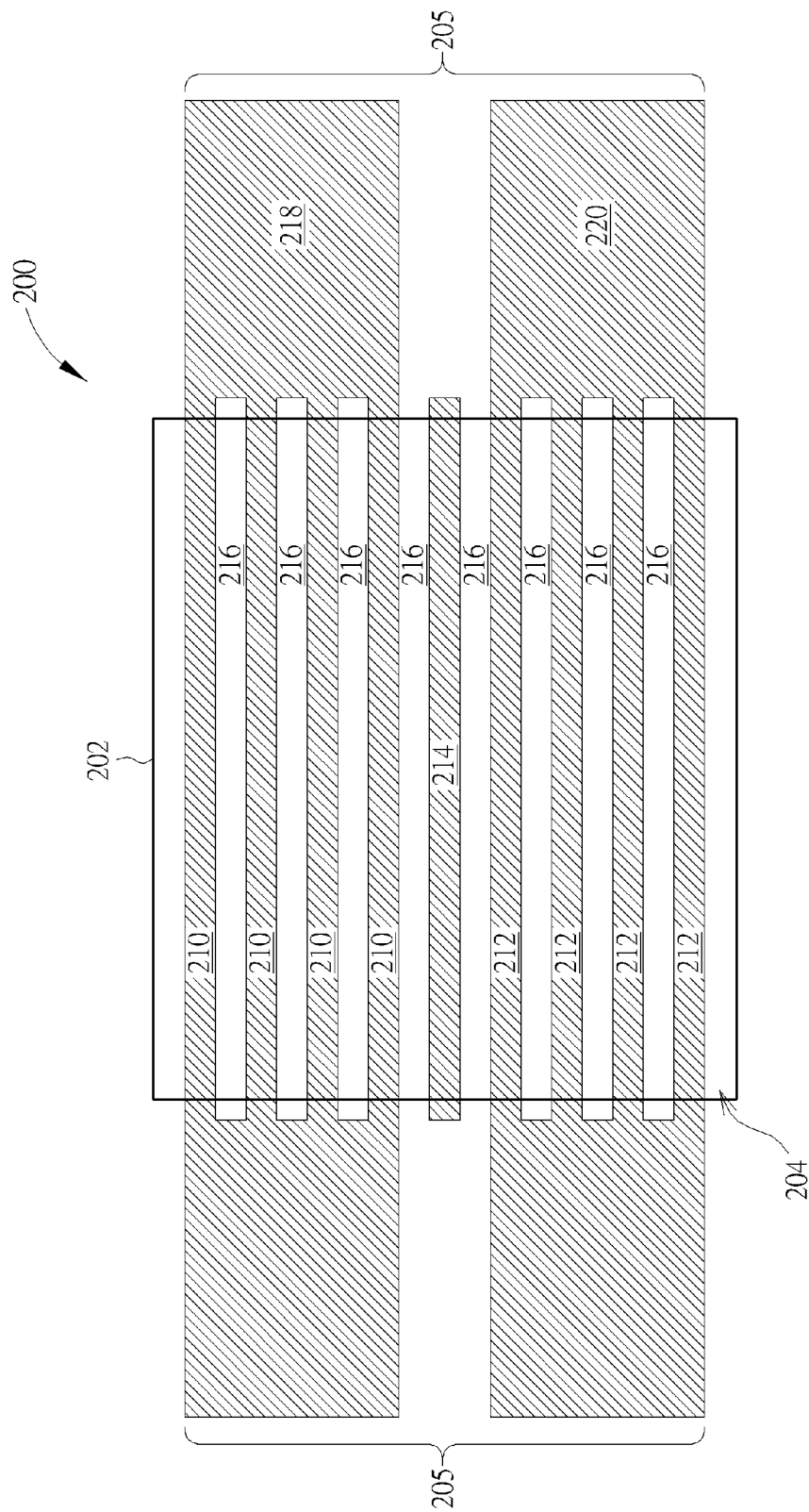
FIG. 3 is a simplified top-view diagram of the semiconductor device in FIG. 2.

Please refer to FIG. 2 and FIG. 3. FIG. 2 is a simplified cross-sectional diagram of a semiconductor device 200 according to a first exemplary embodiment of the present invention, and FIG. 3 is a simplified top-view diagram of the semiconductor device 200, wherein the semiconductor device 200 can be a chip. As shown in FIG. 2 and FIG. 3, the semiconductor device 200 comprises: a metal pad 202, a first specific metal layer routing 204, and a second specific metal layer routing 205. The metal pad 202 is positioned on a first metal layer 206 of the semiconductor device 200, wherein the metal pad 202 has a thickness smaller than 20 KA (i.e. 2 micrometers), and material of the metal pad 202 can be aluminum. The first specific metal layer routing 204 is formed on a second metal layer 208 of the semiconductor device 200, and directly under the metal pad 202. In addition, please note that the above embodiment is only for an illustrative purpose and is not meant to be a limitation of the present invention.

The first specific metal layer routing 204 has a uniform pattern, wherein the uniform pattern has a metal density range between 30% and 70%. Please note that if the metal density of the uniform pattern is higher than 70%, the first specific metal layer routing 204 under the metal pad 202 will fail. If the metal density of the uniform pattern is lower than 30%, it will be hard to design the first specific metal layer routing 204 under the metal pad 202. As shown in FIG. 3, the first specific metal layer routing 204 comprises four first power lines 210, four first ground lines 212, and an unused metal line 214, wherein there are oxide regions 216 between the first power lines 210, the first ground lines 212, and the unused metal line 214, and each oxide region 216 can have a width greater than 2 micrometers. In addition, the unused metal line 214 is kept as a dummy pattern for robust bondability. The second specific metal layer routing 205 is formed on the second metal layer 208 of the semiconductor device 200 and connected to the first specific metal layer routing 204, wherein the second specific metal layer routing 205 is not positioned under the metal pad 202. The second specific metal layer routing 205 comprises a second power line 218 and a second ground line 220. Please note that the first metal layer 206 and the second metal layer 208 are adjacent metal layers of the semiconductor device 200, and there is an oxide layer 209 between the first metal layer 206 and the second metal layer 208. In addition, please note that the above embodiment is only for an illustrative purpose and is not meant to be a limitation of the present invention. For example, the numbers of the first power lines 210, the first ground lines 212, and the unused metal line 214 can be changed according to different design requirements.

Briefly summarized, compared with prior art, since the semiconductor device disclosed by the present invention can allow the metal layer routing formed directly under the metal pad, the layout area size of the semiconductor device can be reduced effectively.

Figure 4:
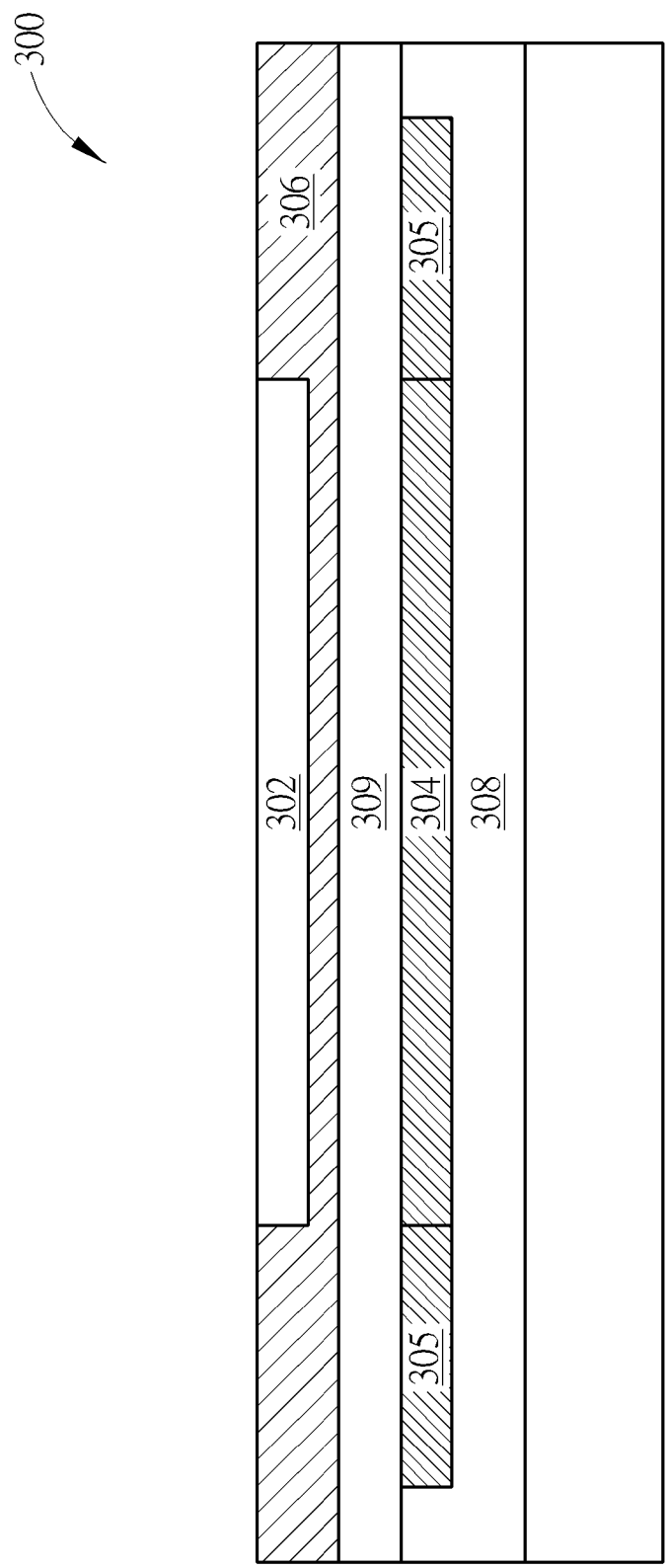
FIG. 4 is a simplified cross-sectional diagram of a semiconductor device according to a second exemplary embodiment of the present invention.
Figure 5:
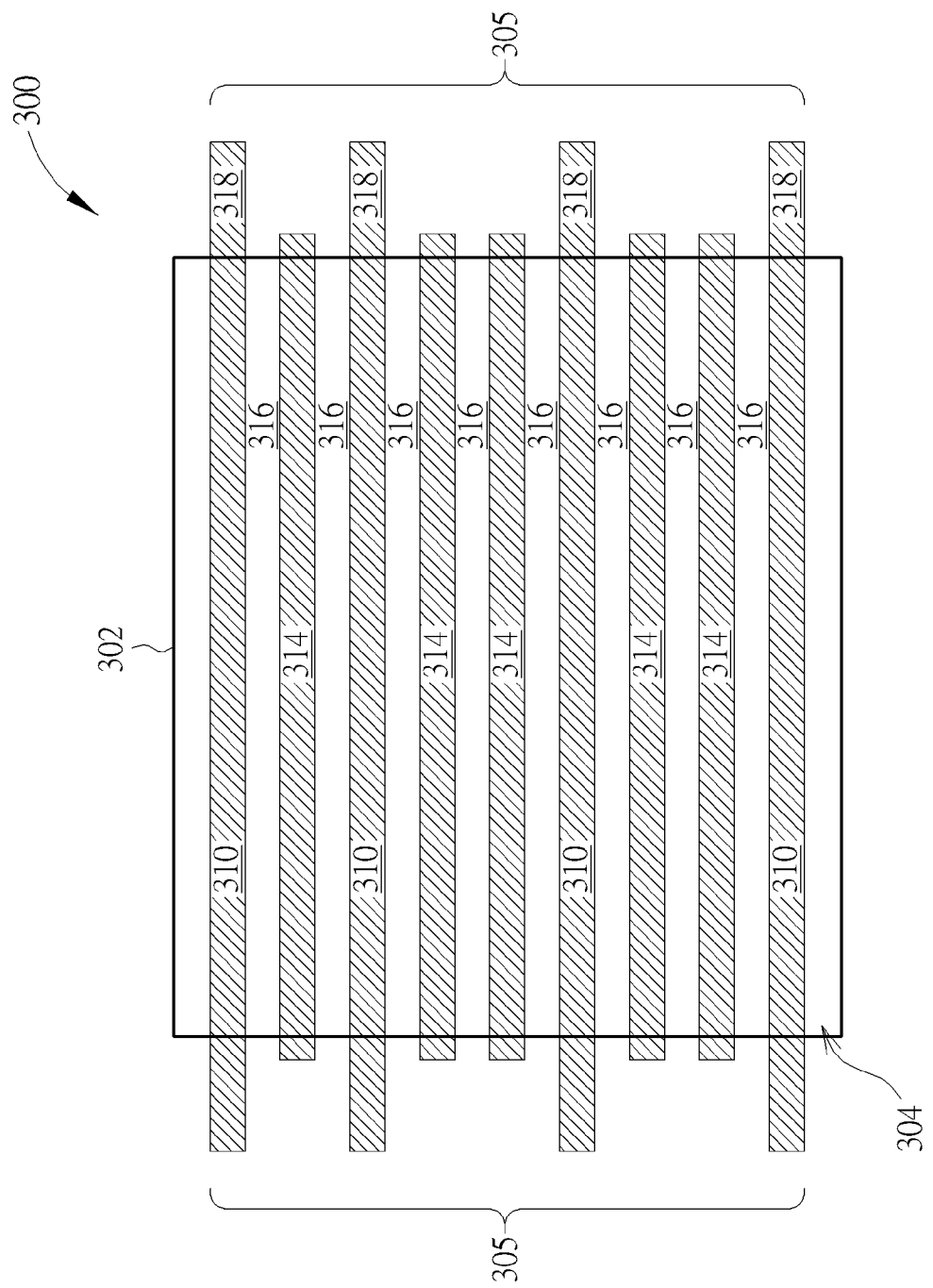
FIG. 5 is a simplified top-view diagram of the semiconductor device in FIG. 4.

Please refer to FIG. 4 and FIG. 5. FIG. 4 is a simplified cross-sectional diagram of a semiconductor device 300 according to a second exemplary embodiment of the present invention, and FIG. 5 is a simplified top-view diagram of the semiconductor device 300, wherein the semiconductor device 300 can be a chip. As shown in FIG. 4 and FIG. 5, the semiconductor device 300 comprises: a metal pad 302, a first specific metal layer routing 304, and a second specific metal layer routing 305. The metal pad 302 is positioned on a first metal layer 306 of the semiconductor device 300, wherein the metal pad 302 has a thickness smaller than 20 KA (i.e. 2 micrometers), and material of the metal pad 302 can be aluminum. The first specific metal layer routing 304 is formed on a second metal layer 308 of the semiconductor device 300, and directly under the metal pad 302. In addition, please note that the above embodiment is only for an illustrative purpose and is not meant to be a limitation of the present invention.

The first specific metal layer routing 304 has a uniform pattern, wherein the uniform pattern has a metal density range between 30% and 70%. Please note that if the metal density of the uniform pattern is higher than 70%, the first specific metal layer routing 304 under the metal pad 302 will fail. If the metal density of the uniform pattern is lower than 70%, it will be hard to design the first specific metal layer routing 304 under the metal pad 302. As shown in FIG. 5, the first specific metal layer routing 304 comprises four first IO routing lines 310 and five unused metal lines 314, wherein there are oxide regions 316 between the first IO routing lines 310 and five unused metal lines 314, and each oxide region 316 can have a width greater than 3 micrometers. In addition, the unused metal lines 314 are kept as a dummy pattern for robust bondability. The second specific metal layer routing 305 is formed on the second metal layer 308 of the semiconductor device 300 and connected to the first specific metal layer routing 304, wherein the second specific metal layer routing 305 is not positioned under the metal pad 302. The second specific metal layer routing 305 comprises four second IO routing lines 318, wherein the second IO routing lines 318 can have at least a via plug for connecting to other metal line in other metal layer. Please note that the first metal layer 306 and the second metal layer 308 are adjacent metal layers of the semiconductor device 300, and there is an oxide layer 309 between the first metal layer 306 and the second metal layer 308. In addition, please note that the above embodiment is only for an illustrative purpose and is not meant to be a limitation of the present invention. For example, the numbers of the first IO routing lines 310 and the unused metal line 314 can be changed according to different design requirements.

Briefly summarized, compared with prior art, since the semiconductor device disclosed by the present invention can allow the metal layer routing formed directly under the metal pad, the layout area size of the semiconductor device can be reduced effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a metal pad, positioned inside a first metal layer of the semiconductor device; and
   a first specific metal layer routing, formed on a second metal layer of the semiconductor device, and directly under the metal pad.

2. The semiconductor device of claim 1, wherein the metal pad has a thickness smaller than 20 KA.

3. The semiconductor device of claim 1, wherein material of the metal pad is aluminum.

4. The semiconductor device of claim 1, wherein the first specific metal layer routing has a uniform pattern.

5. The semiconductor device of claim 4, wherein the uniform pattern has a metal density range between 30% and 70%.

6. The semiconductor device of claim 1, wherein the first specific metal layer routing comprises a plurality of first power lines.

7. The semiconductor device of claim 6, wherein there are oxide regions between the first power lines, and each oxide region has a width greater than 2 micrometers.

8. The semiconductor device of claim 1, wherein the first specific metal layer routing comprises a plurality of first ground lines.

9. The semiconductor device of claim 8, wherein there are oxide regions between the first ground lines, and each oxide region has a width greater than 2 micrometers.

10. The semiconductor device of claim 1, wherein the first specific metal layer routing comprises a plurality of first input/output (IO) routing lines.

11. The semiconductor device of claim 10, wherein there are oxide regions between the first IO routing lines, and each oxide region has a width greater than 2 micrometers.

12. The semiconductor device of claim 1, further comprising:
   a second specific metal layer routing, formed on the second metal layer of the semiconductor device and connected to the first specific metal layer routing, wherein the second specific metal layer routing is not directly positioned under the metal pad.

13. The semiconductor device of claim 11, wherein the second specific metal layer routing comprises a second power line.

14. The semiconductor device of claim 11, wherein the second specific metal layer routing comprises a second ground line.

15. The semiconductor device of claim 11, wherein the second specific metal layer routing comprises a plurality of second input/output (IO) routing lines.

16. The semiconductor device of claim 1, wherein the semiconductor device is a chip.

17. The semiconductor device of claim 1, wherein the first metal layer and the second metal layer are adjacent metal layers of the semiconductor device.

18. The semiconductor device of claim 6, wherein the first specific metal layer routing comprises at least one unused metal line kept as a dummy pattern.

19. The semiconductor device of claim 10, wherein the first specific metal layer routing comprises at least one unused metal line kept as a dummy pattern.

20. The semiconductor device of claim 15, wherein the second input/output (IO) routing lines have at least a via plug for connecting to another metal layer.

* * * * *